United States Patent [19]

Zahn

[11] Patent Number: 4,807,357

[45] Date of Patent: Feb. 28, 1989

[54] METHOD AND APPARATUS FOR BENDING AND INSERTING PIN IN ONE SEQUENTIAL OPERATION

[75] Inventor: Irwin Zahn, New York, N.Y.

[73] Assignee: Autosplice, Inc., Woodside, N.Y.

[21] Appl. No.: 43,940

[22] Filed: Apr. 29, 1987

[51] Int. Cl.$^4$ .................. H01R 13/41; H05K 13/04
[52] U.S. Cl. .................. 29/845; 29/564.6; 29/747; 29/838; 29/844
[58] Field of Search .............. 29/564.6, 741, 747, 29/835, 838, 844, 845

[56] References Cited

U.S. PATENT DOCUMENTS

| | | | |
|---|---|---|---|
| 4,470,182 | 9/1984 | Zemek et al. | 29/741 X |
| 4,558,514 | 12/1985 | Scrantom | 29/838 |
| 4,598,471 | 7/1986 | Elsbree, Jr. et al. | 29/845 |

Primary Examiner—P. W. Echols
Assistant Examiner—Taylor J. Ross
Attorney, Agent, or Firm—Rosen, Dainow & Jacobs

[57] ABSTRACT

A method for bending and inserting a pin in one sequential operation includes the steps of feeding an end of a pre-notched pin wire, shearing a connector terminal from the end of the wire, clamping one part of the terminal between jaws, displacing the jaws toward a hole in a printed circuit board, displacing a bending sheet at a rate faster than the rate at which the jaws are displaced whereby the bending shoe bends the connector terminal pin while the jaws are moving, and inserting the bent terminal in the hole in the printed circuit board. The apparatus for carrying out the method includes a bending shoe ram and an insertion ram driven at different speeds and with different stroke lengths by an eccentric pin mounted on the end of a drive shaft.

12 Claims, 8 Drawing Sheets

METHOD AND APPARATUS FOR BENDING AND INSERTING PIN IN ONE SEQUENTIAL OPERATION

FIELD OF THE INVENTION

This invention relates to a method and apparatus for inserting bent connector terminal pins in a printed circuit board.

BACKGROUND OF THE INVENTION

In accordance with the prior art method of inserting bent terminal pins in a printed circuit board, a plurality of straight terminal pins are inserted in an insulating header and protruding portions of the arrayed terminal pins are then bent in accordance with the technical requirements.

Thereafter the ends of all the terminal pins are inserted simultaneously in corresponding holes formed in the printed circuit board. In this manner an array of bent pins can be mounted on a printed circuit board with an insulating header for holding the terminal pins in a predetermined orientation.

In accordance with a prior art method of bending and soldering terminal leads to a circuit module, as disclosed in U.S. Pat. No. 3,283,987, an automatic machine is provided with means for forming short right-angle bends in ribbon leads and then advancing the bent ends into position to be soldered to a heat-sensitive circuit. As depicted in FIG. 14 of this patent, the ribbon leads are first bent by a downward stroke of bending blade 47. Then, as shown in FIG. 16, the ribbon leads are severed by a subsequent upward stroke of cutter blade 46. The bent sections of the leads are then moved into the soldering position.

Thus, the prior art methods for mounting bent leads on a printed circuit board or the like are disadvantageous in that they require that a plurality of separate operations be performed. In particular, the steps of bending and mounting the terminal pin are performed at different stages by different equipment. This requires a complicated apparatus and leads to inefficiency and increased manufacturing costs.

SUMMARY OF THE INVENTION

The object of the invention is to overcome the disadvantages of the prior art by providing a method and an apparatus whereby bending of a connector terminal pin is performed during insertion of the connector terminal pin in a printed circuit board. In particular, in accordance with the preferred embodiment of the invention the bending operation takes place during the downward stroke of the jaws which cut, hold and insert the connector terminal pin.

A further object of the invention is to provide a method for inserting bent connector terminal pins in a printed circuit board without using an insulating header.

A further object of the invention is to provide an apparatus capable of cutting, bending and inserting a connector terminal pin with one revolution of a drive shaft which drives two rams at different speeds and with different stroke lengths.

A further object of the invention is to provide an apparatus whereby a cam follower coupled to a grooved cam axially mounted on the main shaft controls the opening and closing of the cutting jaw in timed relationship to the feeding of pins from a notched wire wound on a reel.

The foregoing objects are attained in accordance with the invention by a method comprising four steps: (1) advancing the notched wire by the length of a pin, whereby the end connector terminal pin of the wire is fed into a jaw assembly comprising a cutting jaw and an insertion jaw; (2) pushing the cutting jaw to the closed position, whereby the end connector terminal pin is severed from the notched wire and clamped between the cutting and insertion jaws; (3) displacing the cutting and insertion jaws vertically downward in tandem; and (4) displacing the bending shoe vertically in a downward stroke at a speed greater than the speed of the cutting and insertion jaws during a portion of the downward stroke of the jaws and at a speed less than the speed of the cutting and insertion jaws during the remaining portion of the downward stroke of the jaws, whereby the connector terminal pin is first bent by the bending shoe and then inserted by the cutting and insertion jaws in a hole in a printed circuit board. The next pin of the notched wire is fed into the jaw assembly during the upward return strokes of the bending shoe and the cutting and insertion jaws.

The apparatus in accordance with the preferred embodiment of the invention comprises a feed pawl for engaging the notch between the last and the next to last pins in the notched wire, the last pin of the notched wire being advanced into the jaw assembly by displacement of the feed pawl. The apparatus further comprises an insertion ram on which the insertion jaw and cutting jaw are mounted and a bending shoe ram on which the bending shoe is mounted. The insertion ram and bending shoe ram are respectively vertically displaceable in response to rotation of an eccentric pin about the drive shaft axis. The rams are coupled to the eccentric pin by respective linkage assemblies.

The bending of the connector terminal pin being inserted takes place during the period in the cycle when the bending shoe ram is displaced vertically faster than the insertion ram. The insertion of the connector terminal pin in a hole in the printed circuit board is completed when the eccentric pin is at the bottom dead center position (that is, after 180 degrees of clockwise rotation).

The eccentric pin comprises first and second cylindrical portions and having different diameters and relatively offset central axes. The insertion ram is linked to the first cylindrical portion and the bending shoe ram is linked to the second cylindrical portion. Because of the offset of the respective axes of the first and second cylindrical portions and of the eccentric pin, the stroke length of the bending shoe ram is greater than the stroke length of the insertion ram by an amount equal to two times the offset.

BRIEF DESCRIPTION OF THE DRAWINGS

The preferred embodiment of the invention will hereinafter be described in detail with reference to the following drawings.

DETAILED DESCRIPTION OF THE PREFERRED EMBODIMENT

Figure 1A:
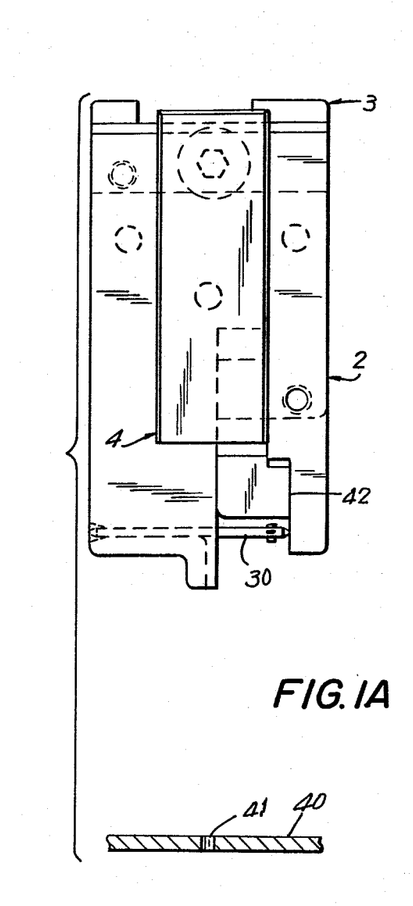
FIGS. 1A–1C are three front views of the jaw assembly and the bending shoe in accordance with the preferred embodiment of the invention when the jaw assembly and bending shoe are in the feeding/cutting, bending and insertion positions respectively.
Figure 1B:
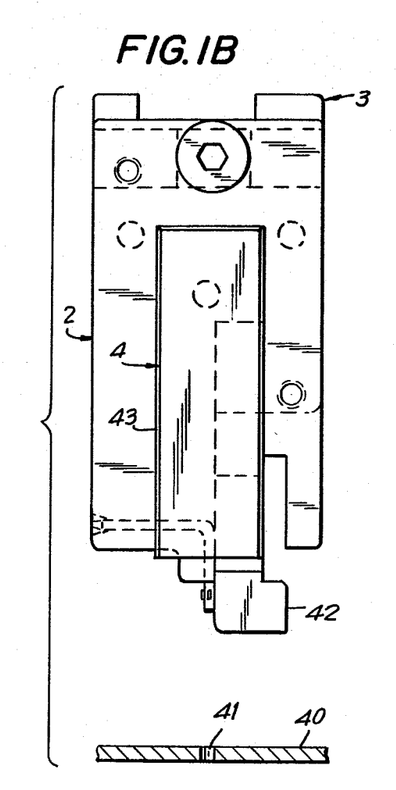
Figure 1C:
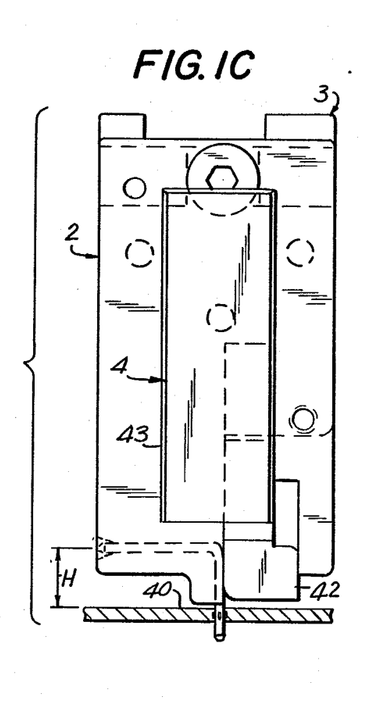

The assembly which shears, clamps, bends and inserts a connector terminal pin fed from a notched wire in accordance with the preferred embodiment of the invention is shown in FIGS. 1A-1C.

Figure 5:
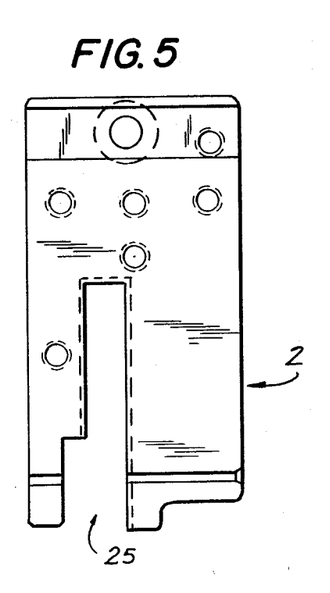
FIG. 5 is a back view of the insertion jaw in accordance with the preferred embodiment of the invention.
Figure 9:
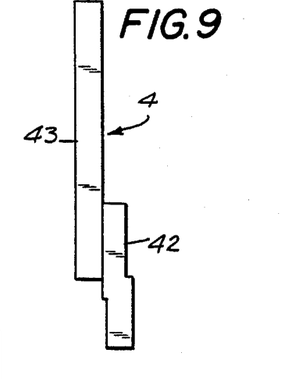
FIG. 9 is a side view of the bending shoe in accordance with the preferred embodiment of the invention.

In the feeding/cutting stage depicted in FIG. 1A, an insertion jaw 2 and a cutting jaw 3 cooperate to clamp the fed connector terminal pin in a horizontal position after the cutting jaw 3 has sheared the connector terminal pin from the notched wire. As can be best seen in FIGS. 5 and 6, the insertion and cutting jaws have respective windows 25 and 35 for receiving the head 42 of the bending shoe 4. The head 42 is securely mounted on mounting plate 43, as best seen in FIG. 9. As shown in FIG. 1A, when the jaw assembly is in the cutting position, the bottom of the head 42 of the bending shoe 4 is vertically located slightly above the horizontally clamped connector terminal pin.

FIG. 1B shows the bending stage after the head 42 of the bending shoe 4 has bent the clamped connector terminal pin to form a right angle. Although the position shown in FIG. 1B will be referred to as the bending stage, the insertion operation is already in progress, as evidenced by the descent of the jaw assembly relative to its position in FIG. 1A. As will be described in detail hereinafter, during a first portion of the jaw assembly descent, the bending shoe 4 descends at a faster rate than the jaw assembly, whereby the head 42 of the bending shoe 4 overtakes and passes the clamped position of the connector terminal pin. The connector terminal pin is bent when overtaken by the head 42.

During the remaining portion of the jaw assembly descent, the bending shoe 4 is vertically displaced at a rate less than the rate of vertical displacement of the jaw assembly, whereby the end of the bent portion of the connector terminal pin overtakes and passes the bottom of head 42. The respective strokes of the jaw assembly and the bending shoe terminate at slightly different heights above the printed circuit board 40. During the final phase of the downward stroke of the jaw assembly, the end of the bent connector terminal pin is inserted in the hole 41 in the printed circuit board 40, as shown in FIG. 1C. During insertion of the connector terminal pin in hole 41, the head 42 of the bending shoe 4 helps support the bent pin during insertion and control overbending of the pin by acting as a reaction point.

The jaw assembly and the bending shoe depicted in FIGS. 1A-1C are respectively mounted on separate vertically displaceable rams. Because these rams are each operatively coupled to an eccentric pin mounted on the end of a rotating drive shaft by respective linkage assemblies pivotably mounted on the eccentric pin, the vertical displacement of these rams is coordinated, as will be described in detail hereinafter.

Figure 2:
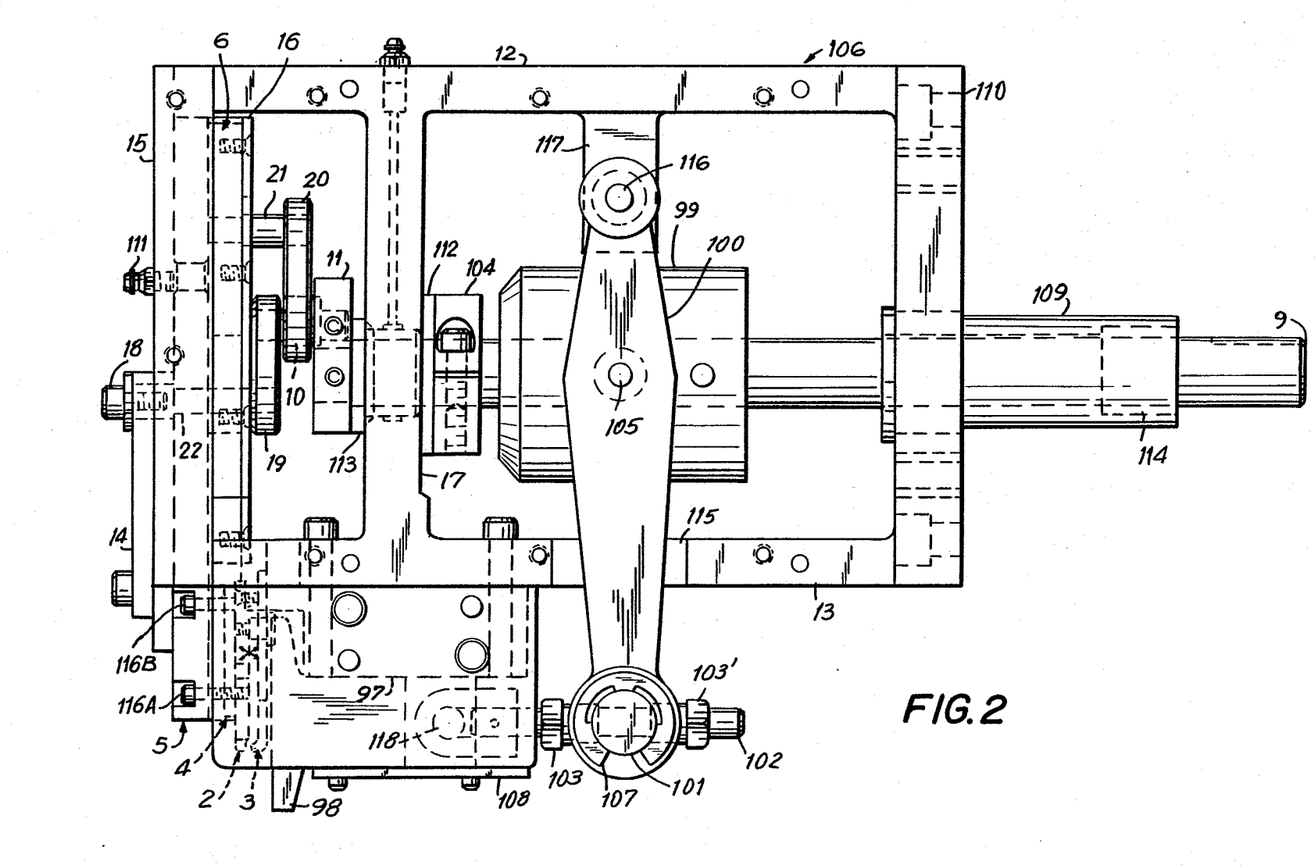
FIG. 2 is a side view of the head assembly in accordance with the preferred embodiment of the invention.
Figure 3:
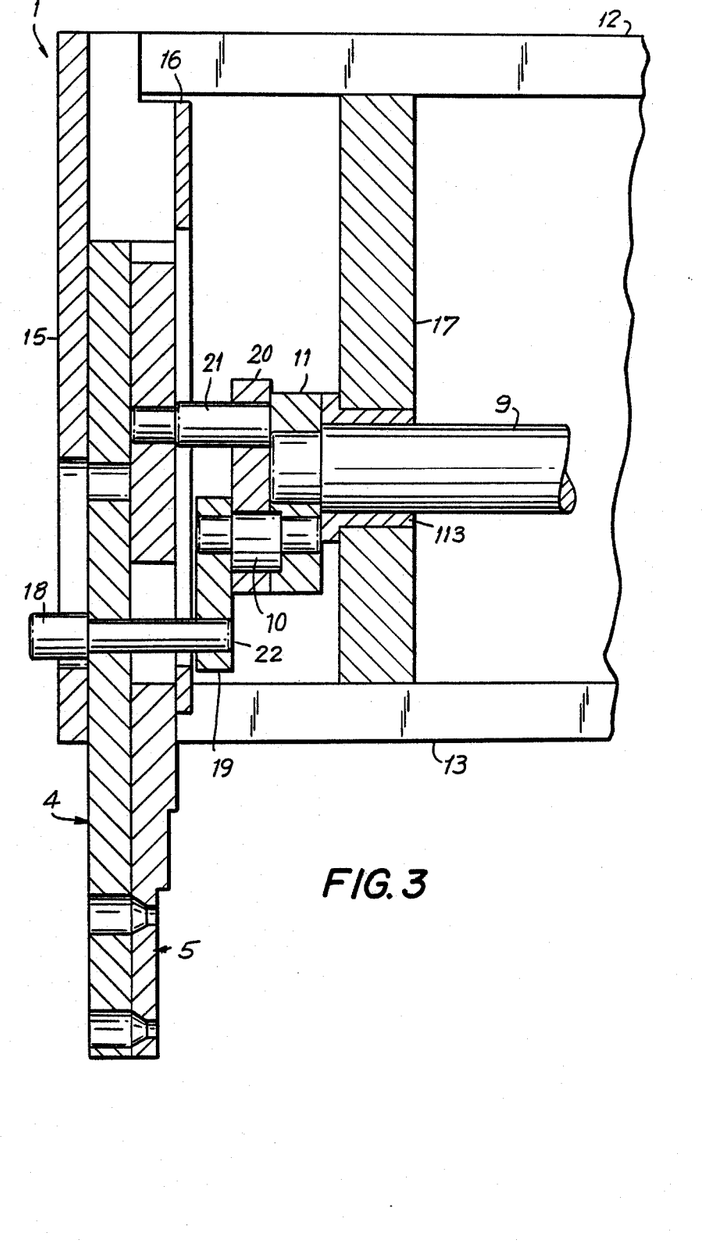
FIG. 3 is a cross-sectional view of the head assembly in accordance with the preferred embodiment of the invention.
Figure 10A:
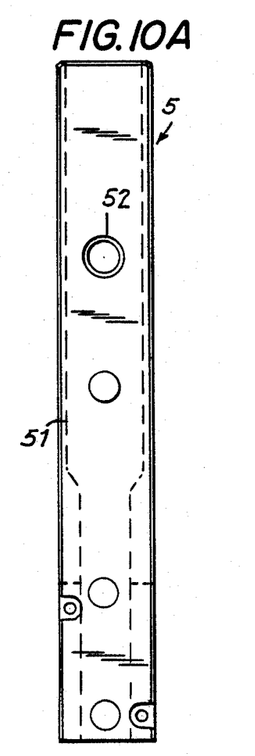
FIGS. 10A and 10B are front and top views respectively of the insertion ram in accordance with the preferred embodiment of the invention.
Figure 10B:
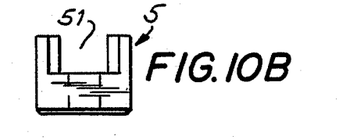

A detailed side view of the head assembly 1 in accordance with the preferred embodiment of the invention is shown in FIG. 2. The insertion jaw 2 (shown by dashed lines) is securely mounted on the insertion ram 5 in any conventional manner. The insertion ram 5 (shown in detail in FIGS. 10A and 10B) is slidably arranged in a vertical guideway (not shown) formed in the front plate 15.

Figure 4A:
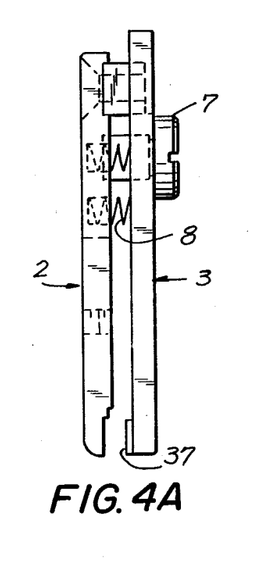
FIGS. 4A and 4B are side and top views respectively of the jaw assembly in accordance with the preferred embodiment of the invention.
Figure 4B:
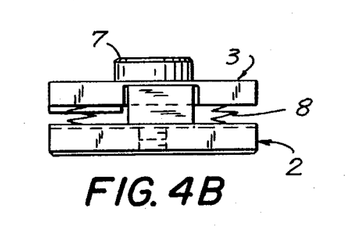

The cutting jaw 3 (shown by dashed lines in FIG. 2) is resiliently connected to the insertion jaw 2 by a plurality of springs 8 and is loosely coupled to shoulder screw 7 (see FIGS. 4A and 4B), which serves to hold the insertion jaw 2 and cutting jaw 3 together as an assembly. The cutting jaw 3 is guided on three sides by guide means (not shown). As the result of this arrangement, the cutting jaw 3 can be displaced toward the insertion jaw 2 by cutoff slide 98 (to be described in detail hereinafter). When cutoff slide 98 is no longer pressing the cutting jaw 3 against the insertion jaw 2, the springs 8 urge the cutting jaw 3 away from the insertion jaw 2. The position of the cutting jaw 3 whereat the cutting jaw 3 and the insertion jaw 2 are in contact will hereinafter be referred to as the closed position of the cutting jaw 3, while the position of the cutting jaw 3 whereat the cutting jaw 3 and the insertion jaw 2 are apart will hereinafter be referred to as the open position.

Figure 6:
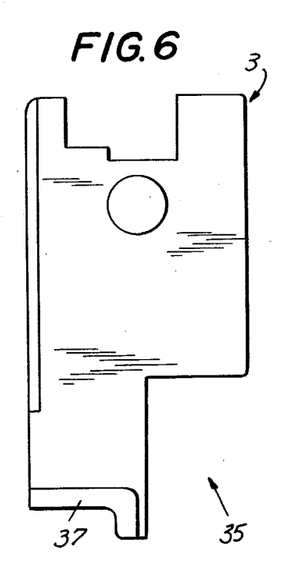
FIG. 6 is a front view of the cutting jaw in accordance with the preferred embodiment of the invention.
Figures 7, 8:
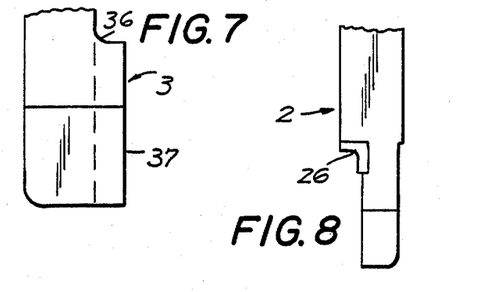
FIG. 7 is a side view of the lower portion of the insertion jaw in accordance with the preferred embodiment of the invention.
FIG. 8 is a side view of the lower portion of the cutting jaw in accordance with the preferred embodiment of the invention.

Immediately after a connector terminal pin has been fed to a position between the separated jaws by the feed module 70 (to be described in detail hereinafter), the cutting jaw 3 is displaced from the open position to the closed position by the cutoff slide 98. During this displacement, the cutting jaw 3 shears the fed connector terminal pin from the notched wire and clamps the cut connector terminal pin against the insertion jaw 2. The opposing surfaces of the respective jaws which clamp the fed connector terminal pin are shown in detail in FIGS. 7 and 8. The shaped or contoured surface 26 on insertion jaw 2 and the shaped or contoured surface 36 on cutting jaw 3 block displacement of the pin in all directions. Thus, in the closed position of the cutting jaw 3, the insertion jaw 2 and the cutting jaw 3 cooperate to securely clamp the sheared connector terminal pin as the bending shoe 4 overtakes the jaws and bends the sheared connector terminal pin prior to pin insertion into the hole of a printed circuit board. Part of the shaped or contoured surface 36 is formed by a portion of the peripheral surface of the shaping anvil 37 formed on the cutting jaw 3, as best seen in FIG. 6. As the head 42 of the bending shoe 4 bends the clamped connector terminal pin, the bend in the connector terminal pin conforms to the peripheral surface of the shaping anvil 37.

Figure 11A:
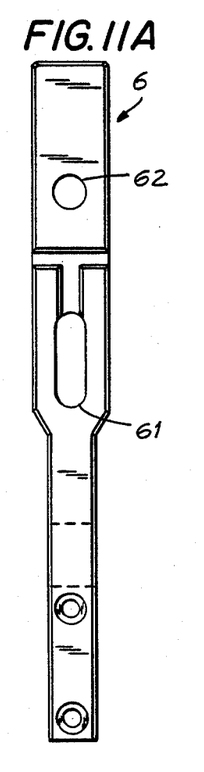
FIGS. 11A and 11B are front and side views respectively of the bending shoe ram in accordance with the preferred embodiment of the invention.
Figure 11B:
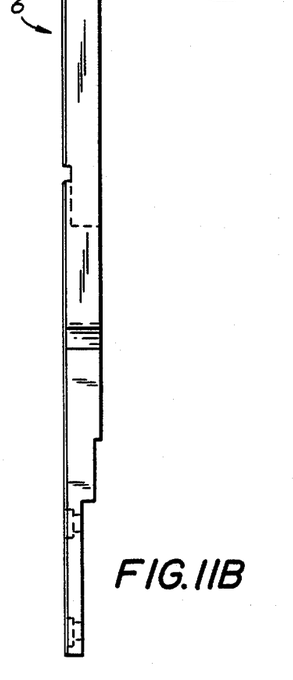

The bending shoe 4 (shown by dashed lines in FIG. 2) is securely mounted on the bending shoe ram 6 in any conventional manner. The bending shoe ram 6 (shown in detail in FIGS. 11A and 11B) is slidably arranged in a vertical groove 51 formed in the insertion ram 5 (see FIGS. 10A and 10B). The insertion ram 5 and the bending shoe ram 6 are maintained in the corresponding vertical grooves by the wear plate 16, which is secured by screws to the front plate 15. The insertion ram 5 is vertically slidable in the guideway formed by the vertical groove in the front plate 15 and a surface of the wear plate 16, whereas the bending shoe ram 6 is vertically slidable in the guideway formed by the vertical groove in the insertion ram 5 and the same surface of the wear plate 16. The rams can be suitably lubricated by way of grease fitting 111 (FIG. 2).

The housing of the head assembly 1 comprises the front plate 15, the top plate 12, the bottom plate 13, the back mounting plate 110 and the bearing plate 17. The top plate 12, the bottom plate 13 and the bearing plate 17 are integrally formed and constitute the interchangeable head body 106. The front plate 15 and the back mounting plate 110 are respectively mounted on the interchangeable head body 106 by screws.

The drive shaft 9 is rotatably supported by flanged bearing 113 and plain bearing 114. The flanged bearing 113 is securely mounted in bearing plate 17. The plain bearing 114 is securely mounted in shaft support sleeve 109, which is in turn securely mounted in back mounting plate 110. The drive shaft 9 is axially fixed in the housing by the flange of flanged bearing 113 and by the clamping collar 104. The thrust washer 112 is arranged between the clamping collar 104 and the bearing plate 17.

The insertion ram 5 and the bending shoe ram 6 are driven in the vertical direction by a linkage assembly coupled to a hub assembly mounted on the end of the drive shaft 9. The hub assembly (shown in detail in FIG. 12) comprises a hub 11 securely mounted on the end of the drive shaft 9 and an eccentric pin 10 securely mounted in the hub 11. The drift shaft 9 is received by bore 55 formed in hub 11. The linkage assembly comprises a bending shoe link 20 (shown in detail in FIG. 13) the first end of which has a hole 57 for pivotable mounting on the eccentric pin 10, an insertion link 19 (similar in structure to the bending shoe link) the first end of which has a hole (not shown) for pivotable mounting on the eccentric pin 10, a bending shoe pin 21 the first end of which is securely mounted in the hole 56 formed in a hole (not shown) formed in the second end of the bending shoe link 20, and a stud 22 the end of which is securely mounted in the second end of the insertion link 19. The second end of the bending shoe pin 21 is pivotably mounted in a hole 62 formed in the bending shoe ram 6 (see FIG. 11A). The shaft of the stud 22 is pivotably mounted in a hole 52 formed in the insertion ram 5 and the feed arm 14. Because the rams move at different speeds with different stroke lengths, a slot 61 is provided in bending shoe ram 6 to provide play for the stud 22 extending therethrough.

Figure 12:
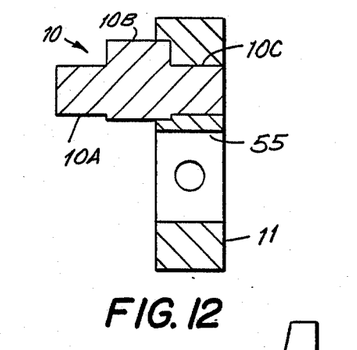
FIG. 12 is a cross-sectional view of the hub assembly in accordance with the preferred embodiment of the invention.
Figure 13:
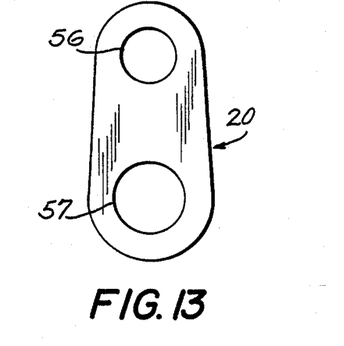
FIG. 13 is a front view of the bending shoe link in accordance with the preferred embodiment of the invention.

The eccentric pin 10 comprises three circular cylindrical portions as best seen in FIG. 12. The first cylindrical portion 10A is arranged in a hole (not shown) formed in the first end of insertion link 19. The second cylindrical portion 10B comprises a part which is inserted in a first bore section 58 of the hub 11 and a part which is inserted in the hole 57 (see FIG. 13) formed in the first end of the bending shoe link 20. The third cylindrical portion 10C is arranged entirely within a second bore section 59 formed in the hub 11. The third cylindrical portion 10C can be securely connected to hub 11 in any conventional manner. The first and second bore sections 58 and 59 of the hub 11 have different diameters, are in communication, and are not coaxial. Correspondingly, the second cylindrical portion 10B and the third cylindrical portion 10C have different diameters and are not coaxial. In addition, the first cylindrical portion 10A and the second cylindrical portion 10B have different diameters and are not coaxial. The central axes of the first and second cylindrical portions 10A and 10B are offset relative to each other. The kinematic operation of the linkage and hub assemblies will be described in detail hereinafter in connection with FIGS. 17A–17C.

The position of the cutting jaw 3 is controlled by the cutoff slide 98 (shown in detail in FIGS. 14A–14C), which is operatively coupled to the cutoff cam 99 securely mounted on drive shaft 9. The cutoff cam 99 is a cylinder having a looped track (not shown) formed on its peripheral surface. The looped track has constant width and a center line having an axial position which varies around the cam circumference. This change in axial position of the track center line is used to control the opening and closing of the cutting jaw in a conventional manner.

A cam follower 105 rides in the looped track (not shown in FIG. 2) during rotation of the drive shaft 9. During travel along a first track portion, the cam follower 105 remains substantially stationary in a first position. At the end of the first track portion, the cam follower 105 enters a second track portion. During travel in the second track portion, the cam follower 105 is axially displaced toward a second position. The second position is reached when the cam follower 105 enters a third track portion. During travel in the third track portion, the cam follower 105 remains substantially stationary in the second position. At the end of the third track portion, the cam follower 105 enters a fourth track portion. During travel in the fourth track portion, the cam follower 105 is axially displaced back to the first position. This cycle of travel occurs during each rotation of the drive shaft 9.

The cam follower 105 is securely mounted on a cam follower mount lever 100, which is pivotably mounted on lever pivot 116, as shown in FIG. 2. The lever pivot 116 is in turn securely mounted on the mounting member 117 connected to the interchangeable head body 106. In response to axial displacement of the cam follower 105 between its first and second positions, the cam follower mount lever 100 pivots about lever pivot 116. The driver link pivot pin 101 is pivotably mounted on the end of the cam follower mount lever 100 remote from the lever pivot 116 and is held in place by retaining ring 107. A cutoff slide driver link 102 is securely coupled to driver link pivot pin 101 by locking nuts 103 and 103'. During pivoting of the cam follower mount lever 100, the driver link pivot pin 101 is displaced along an arc. During the displacement the driver link pivot pin 101 pivots relative to the cam follower mount lever 100 to compensate for the changing angle between the cam follower mount lever 100 and the cutoff slide driver link 102. The cutoff slide driver link 102 is pivotably coupled to the cutoff slide 98 by pivot pin 118 to compensate for the changing angular position of the cutoff slide driver link 102 relative to the cutoff slide 98 due to the vertical component of the displacement of driver link pivot pin 101.

Figures 14A, 14B, 14C, 16:
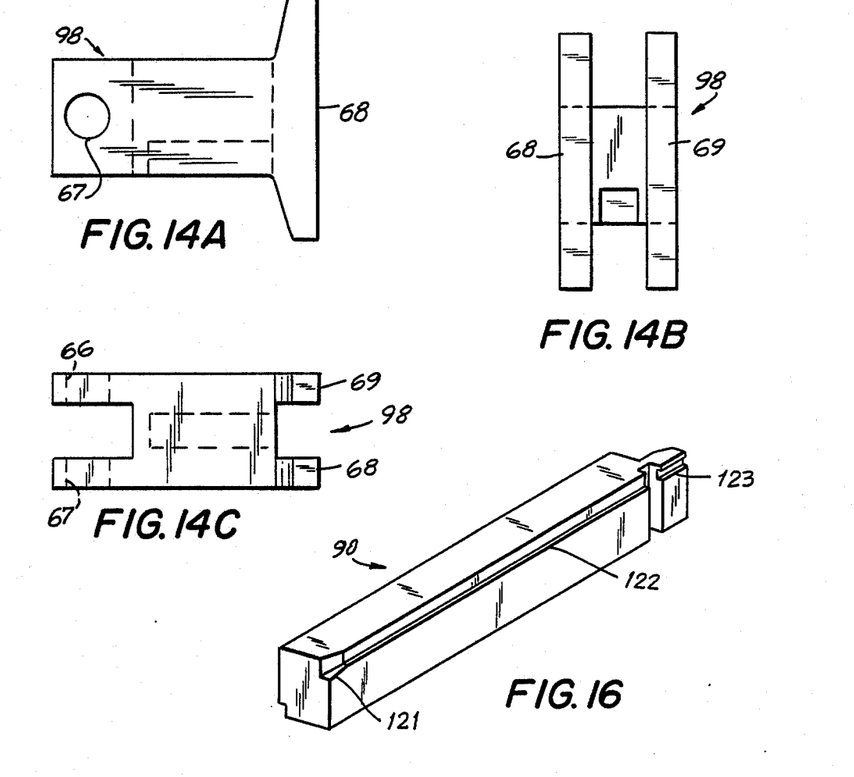
FIGS. 14A-14C are side, front and top views respectively of the cutoff slide in accordance with the preferred embodiment of the invention.
FIG. 16 is a perspective view of the wire guide incorporated in the feed module in accordance with the preferred embodiment of the invention.

The cutoff slide 98 has a pair of holes 66 and 67 for receiving the pivot pin 118, and a pair of planar contact members 68 and 69 which are thrust against the cutting jaw 3 during displacement of the cutting jaw toward its closed position. The cutoff slide 98 is axially slidable in a guideway formed by housing 97 and slide retainer 108. During pivoting of the cam follower mount lever 100 in the clockwise direction as the cam follower 105 rides along the second track portion, i.e. is displaced toward its second position, the cutoff slide 98 is forwardly axially displaced until the cutting jaw 3 has been thrust to its open position. As the cam follower 105 rides in the third track portion, the cutoff slide 98 maintains the cutting jaw 3 in the closed position. When the cam follower 105 enters the fourth track portion, cam follower 105 is displaced toward the its first position and the cam follower mount lever 100 pivots in the counterclockwise direction, causing the cutoff slide 98 to be rearwardly axially displaced. In response to retraction of the cutoff slide 98, the springs 8 urge the cutting jaw 3 into the open position.

The second track portion is arranged on cutoff cam 99 at an angular position whereby the cam follower 105 enters the second track portion when the eccentric pin 10 is substantially at the top dead center position. At the top dead center position, feeding of the connector terminal pin has been completed. As a result of this coordination of the displacement of the cam follower 105 to the second position and the rotation of the eccentric pin 10 to the top dead center position, the cutting jaw 3 is moved to the closed position immediately following completion of the feeding of the connector terminal pin.

Correspondingly, the fourth track portion is arranged diametrically opposite to the second track portion, whereby the cam follower 105 enters the fourth track portion when the eccentric pin 10 is substantially at the bottom dead center position. At the bottom dead center position, the bent portion of the connector terminal pins has already been inserted in a hole in the underlying printed circuit board. As a result of this coordination of the displacement of the cam follower 105 to the first position and the rotation of the eccentric pin 10 to the bottom dead center position, the cutting jaw 3 is moved to the open position immediately upon insertion of the connector terminal pin in the printed circuit board and before the upward stroke of the insertion ram 5.

Figure 15A:
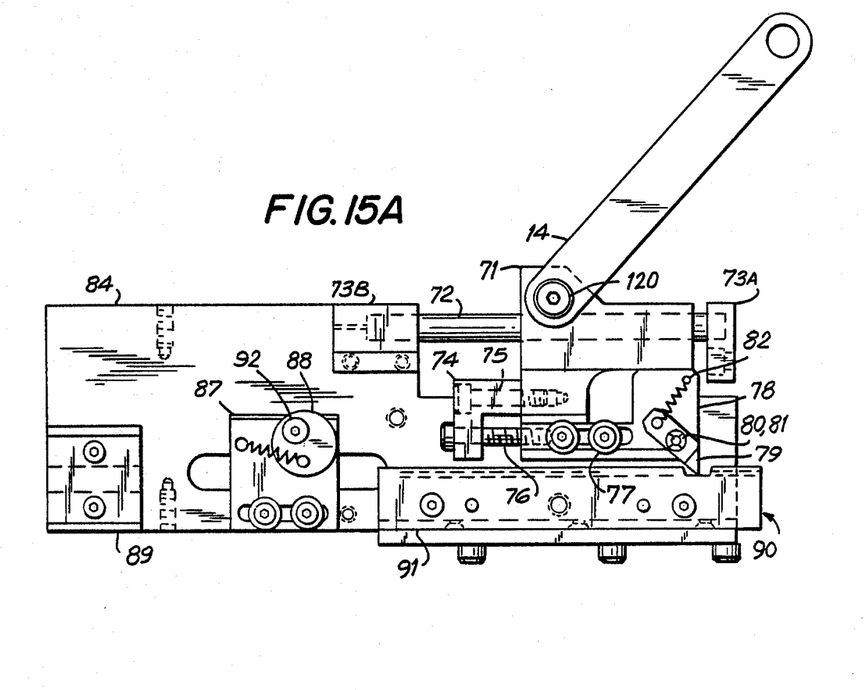
FIGS. 15A and 15B are front and top views respectively of the feed module in accordance with the preferred embodiment of the invention.
Figure 15B:
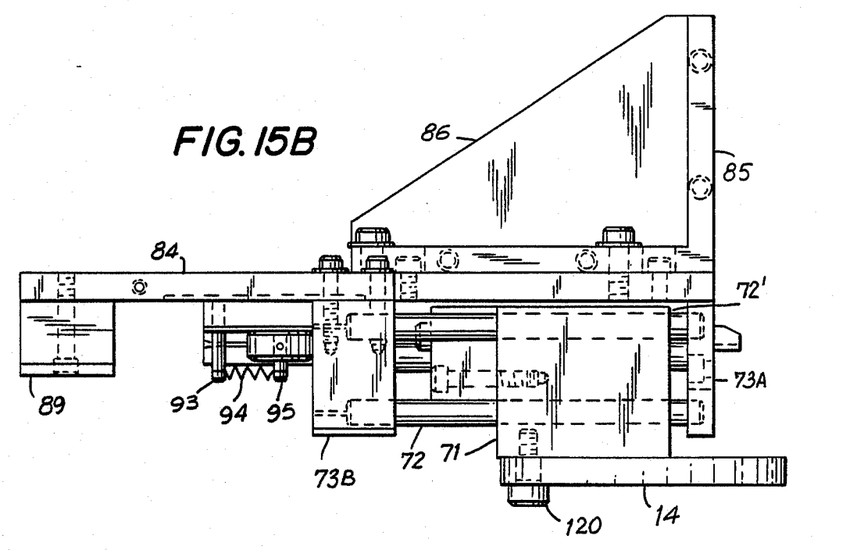

The front and top views of the feed module 70 are respectively presented in FIGS. 15A and 15B. The feed module 70 is shown in an operative position near the position whereat advancement of the fed connector terminal pin has been completed. The notched wire is advanced by engaging feed pawl 79 in the notch which defines the connector terminal pin to be fed and then displacing the feed pawl 79 in the rightward direction (as seen in FIG. 15A). Rightward displacement of the feed pawl 79 results from vertical upward displacement of the upper end of feed arm 14. The hole in the upper end of the feed arm 14 is pivotably mounted on the stud 22, the feed arm 14 being axially held thereon by locking bolt 18. The lower end of the feed arm 14 is pivotably coupled to feed slide 71 by pivot pin 120. The feed slide 71 is axially slidably mounted on guide rods 72 and 72', the ends of which are respectively securely mounted in guide rod mating brackets 73A and 73B. The guide rod mating brackets 73A and 73B are securely connected to feed mating plate 84. The feed mating plate 84 is securely connected to the head assembly 1 by the angle bracket 85, which is reinforced by the gusset 86.

The feed pawl 79 is coupled to the feed slide 71 by an assembly comprising the feed pawl slide 78, the screw 76, and the screw mating bracket 74. The screw mating bracket 74 is securely mounted on the feed slide 71 by the screw 75. The axial position (the axial direction for the feed module is defined by the axes of guide rods 72 and 72', whereas the axial direction for the head assembly was defined by the axis of the drive shaft) of the feed pawl 79 relative to the feed slide 71 can be adjusted by loosening screw 77, axially sliding the feed pawl slide 78 until the feed pawl 79 is in the desired axial position, and then tightening the screw 77.

The feed pawl 79 is pivotably mounted on the pawl pin 80, which is in turn securely connected to feed pawl slide 78. The feed pawl 79 is held on the pawl pin 80 by the retaining ring 81. A spring 121 in a prestressed state is connected between the spring hook pin 82 and a hole in the feed pawl 79. The spring 121 urges the feed pawl 79 to rotate in the clockwise direction, thereby urging the tip of the feed pawl 79 into engagement with the notch defining the connector terminal pin to be fed into the jaw assembly.

The pre-notched pin wire (not shown) forming the connector terminal pin supply is unwound from a reel (not shown) in a conventional manner. The notched pin wire is fed through the feed tube block 89, through the wire stop guide block 87 and then into the groove formed by the wire guide 90 and the wire retainer 91. The structure of the wire guide 90 is best seen in FIG. 16. The surfaces generally indicated by 121 are chamfered for guiding the end of the notched wire into the trough formed by the offset 122 and a surface (not shown) of the wire retainer 91. The tip of the feed pawl engages the notched wire along offset 122. The notched wire then passes through a channel formed by groove 123 of wire guide 90 and the surface of wire retainer 91 previously referred to. When the notched wire is advanced, the last connector terminal pin passes out of groove 123 and into the space between jaws 2 and 3.

Figure 17A:
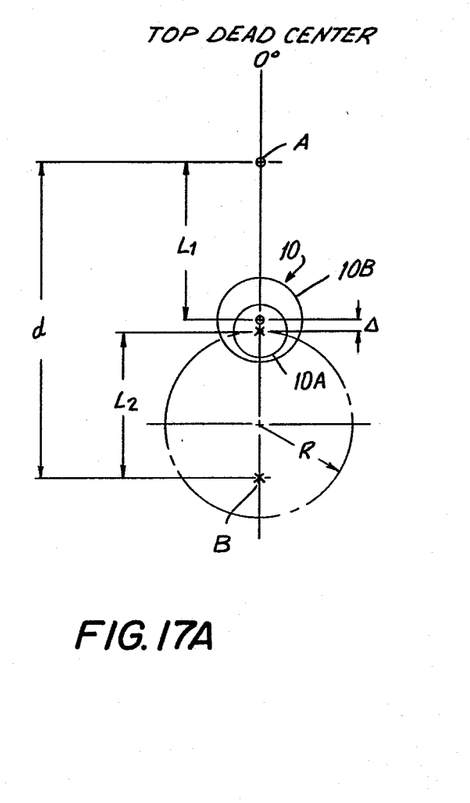
FIGS. 17A-17C constitute a kinematic depiction of three angular positions of the eccentric pin in accordance with the preferred embodiment of the invention.
Figure 17B:
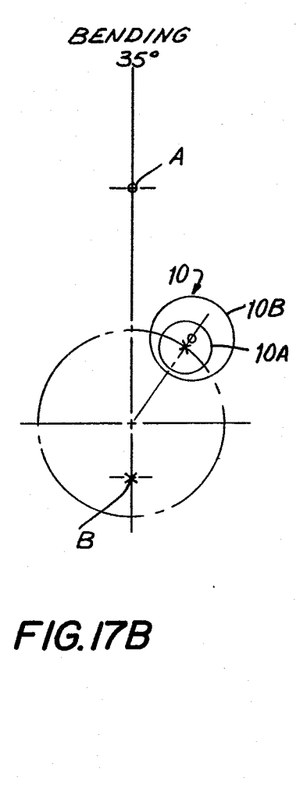
Figure 17C:
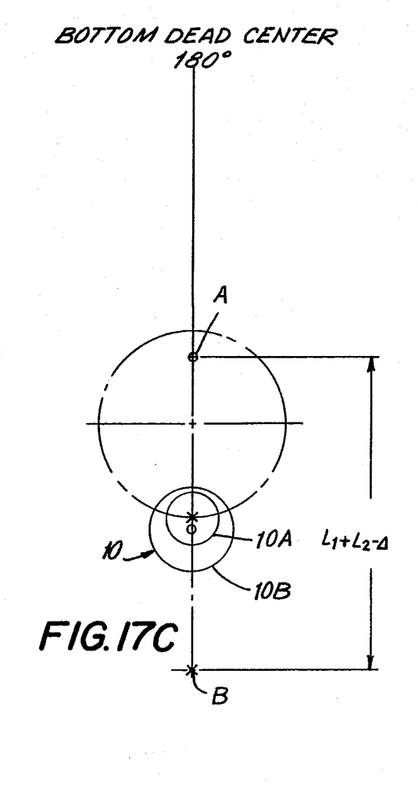

As previously discussed, the eccentric pin 10 is rigidly coupled to the drive shaft 9 by hub 11, the eccentric pin 10 being radially displaced from the axis of the drive shaft 9. The insertion ram 5 is linked to the first cylindrical portion 10A of the eccentric pin 10 by the stud 22 and insertion link 19, whereas the bending shoe ram 6 is linked to the second cylindrical portion 10B of the eccentric pin 10 by the bending shoe pin 21 and the bending shoe link 20. During rotation of the drive shaft 9, the eccentric pin 10 rotates about the drive shaft axis, as shown in FIGS. 17A–17C. As the eccentric pin 10 rotates, the insertion link 19 pivots relative to the first cylindrical portion 10A of the eccentric pin 10 and the bending shoe link 20 pivots relative to the second cylindrical portion 10B of the eccentric pin 10, the first and second cylindrical portions 10A and 10B having different diameters and central axes which are relatively offset. The insertion link 19 is securely connected to the stud 22 and the bending shoe link 20 is securely connected to the bending shoe pin 21. The axes of the holes in bending shoe link 20 are indicated by the symbols "o" in FIGS. 17A-17C, whereas the axes of the holes in insertion link 19 are indicated by the symbols "x". The bending shoe pin 21 and the stud 22 are pivotably mounted in holes 62 and 52 respectively formed in the bending shoe ram 6 and the insertion ram 5.

The rams are displaceable only in the vertical direction, so that only the vertical components of the forces exerted on the bending shoe pin 21 and the stud 22 by the bending shoe link 20 and the insertion link 19 respectively act to displace the respective rams. The relative vertical positions and speeds of the insertion ram 5 and the bending shoe ram 6 are a function of the angular position of the eccentric pin 10. When the eccentric pin 10 is at the top dead center position during rotation of the drive shaft 9 (as shown in FIG. 17A), the axis A of the bending shoe pin 21 and the axis B of the stud 22 are separated by a predetermined maximum distance d. The distance $d = L_1 + L_2 + \Delta$, where $L_1$ is the distance separating the hole axes of link 20, $L_2$ is the distance separating the hole axes of link 19, and $\Delta = [(H + r) - 0.010]/2$ is the offset of the axes of the first and second cylindrical portions 10A, 10B of eccentric pin 10, where H is the height above the surface of the printed circuit board of the central axis of the horizontal portion of the inserted pin (see FIG. 1C), r is the radius of the wire, and the dimension of 0.010 is inches.

As the eccentric pin 10 rotates about the axis of the drive shaft 9 in the clockwise direction (see FIG. 17B), the separation between the axis A of the bending shoe pin 21 and the axis B of the stud 22 decreases steadily until the eccentric pin 10 arrives at an angular position of 90 degrees. As the eccentric pin 10 continues its clockwise rotation about the axis of the drive shaft 9 from the angular position of 90 degrees to the bottom dead center position (shown in FIG. 17C), the distance separating the axis A of the bending shoe pin 21 and the axis B of the stud 22 steadily increases until at the bottom dead center position the separation is equal to $L_1 + L_2 - \Delta$ (i.e. $d - 2\Delta$). Thus, because the distance separating the bending shoe pin 21 and the stud 22 during rotation of the eccentric pin decreases up to the angular position equal to 90 degrees, it is apparent that for the first 90 degrees of clockwise rotation, the bending shoe pin 21 is descending at a speed greater than the speed of descent of the stud 22. Because the bending shoe ram 6 is therefore descending faster than the insertion ram 5, the bending shoe 4 overtakes and passes the connector terminal pin clamped between the insertion and cutting jaws, thereby bending the pin to form a right angle. Conversely, as the eccentric pin 10 rotates from the angular position of 90 degrees to the bottom dead center position, the stud 22 descends at a greater speed than the speed of descent of the bending shoe pin 21. Therefore, the tip of the bent connector terminal pin overtakes and passes the bottom of the head 42 of the bending shoe 4.

Further, as the eccentric pin 10 travels from the top dead center position to the bottom dead center position, the bending shoe pin 21 and the stud 22 are vertically displaced in the downward direction by different amounts. The stud 22 has a downward stroke equal to the diameter of the circle of rotation of the axis of the first cylindrical portion 10A of the eccentric pin 10, whereas the bending shoe pin 21 has a downward stroke equal to the diameter of the circle of rotation of the axis of the second cylindrical portion 10B of the eccentric pin 10. Because the first and second cylindrical portions are offset by a distance $\Delta$, the diameter of the circle of rotation of the axis of the second cylindrical position 10B is equal to the diameter of the circle of rotation of the axis of the first cylindrical portion 10A plus $2\Delta$. Thus, the stroke length of the bending shoe ram 6 is greater than the stroke length of the insertion ram 5 by an amount equal to $2\Delta$.

The foregoing description of the preferred embodiment is presented for illustrative purposes only and is not intended to limit the scope of the invention as defined in the appended claims. Modifications may be readily effected by one having ordinary skill in the art without departing from the spirit and scope of the invention concept herein disclosed. For example, although a 90-degree bend has been illustrated herein and is an industry standard, the principle disclosed herein covers other bend angles as well. Further, the connector terminal pin cross section may be circular, square, rectangular or any other shape.

What is claimed is:

1. A method for inserting a bent connector terminal into a hole in a substrate, comprising the following steps:
    (a) clamping a first portion of said connector terminal by closing a clamping means;
    (b) displacing said clamping means whereby the distance between said connector terminal and said hole decreases;
    (c) displacing a bending means whereby a second portion of said connector terminal not clamped by said clamping means is bent by said bending means during said displacement of said clamping means; and
    (d) terminating said displacement of said clamping means when an end of said bent connector terminal is inserted in said hole.

2. The method as defined in claim 1, wherein said clamping means and said bending means are displaced by translation in a first direction.

3. The method as defined in claim 2, wherein said first direction is substantially perpendicular to a plane of said substrate.

4. The method as defined in claim 2, wherein said bending means and said clamping means are displaced in said first direction simultaneously during a first period of time, said bending means being displaced for a first stroke length and said clamping means being displaced for a second stroke length.

5. The method as defined in claim 4, wherein said first stroke length is different than said second stroke length.

6. The method as defined in claim 4, wherein during a first interval of said first period of time said bending means is being displaced at a speed greater than the speed at which said clamping means is being displaced, and during a second interval of said first period of time said bending means is being displaced at a speed less than the speed at which said clamping means is being displaced.

7. The method as defined in claim 6, wherein bending of said connector terminal occurs during said first interval of said first period of time.

8. The method as defined in claim 4, wherein said bending means and said clamping means are displaced in a second direction during a second period of time, said second direction being opposite to said first direction.

9. The method as defined in claim 2, further comprising the steps of unclamping said first portion of said connector terminal by opening said clamping means after displacement of said clamping means has been terminated, and displacing said clamping and said bending means simultaneously by translation in a second direction, said second direction being opposite to said first direction.

10. The method as defined in claim 9, further comprising the steps of feeding a connector terminal into said opened clamping means during translation of said clamping means in said second direction, and then clamping said fed connector terminal by closing said clamping means.

11. A method for inserting a bent connector terminal into a hole in a substrate, comprising the following steps:
 (a) feeding an end of a pre-notched pin wire into a predetermined position;
 (b) shearing a connector terminal from said end of said wire;
 (c) clamping a first portion of said terminal by closing a clamping means;
 (d) displacing said clamping means whereby the distance between said terminal and said hole decreases:
 (e) displacing a bending means whereby a second portion of said terminal not clamped by said clamping means is bent by said bending means during said displacement of said clamping means; and
 (f) terminating said displacement of said clamping means when an end of said bent terminal is inserted in said hole.

12. An apparatus for bending a connector terminal and inserting said bent connector terminal in a hole in a substrate, comprising:
 (a) means for clamping a first portion of said connector terminal;
 (b) means for displacing said clamping means whereby the distance between said connector terminal and said hole decreases;
 (c) means for bending a second portion of said connector terminal not clamped by said clamping means; and
 (d) means for displacing said bending means whereby said second portion of said connector terminal is bent by said bending means during said displacement of said clamping means,
wherein said means for displacing said clamping means terminates said displacement of said clamping means when an end of said bent connector terminal is inserted in said hole.

* * * * *